US 011387179B2

(12) United States Patent
Shibuya et al.

(10) Patent No.: US 11,387,179 B2
(45) Date of Patent: Jul. 12, 2022

(54) IC PACKAGE WITH HALF-BRIDGE POWER MODULE

(71) Applicant: TEXAS INSTRUMENTS INCORPORATED, Dallas, TX (US)

(72) Inventors: Makoto Shibuya, Beppu (JP); Kengo Aoya, Beppu (JP); Woochan Kim, San Jose, CA (US); Vivek Kishorechand Arora, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/827,455

(22) Filed: Mar. 23, 2020

(65) Prior Publication Data

US 2021/0175165 A1   Jun. 10, 2021

Related U.S. Application Data

(60) Provisional application No. 62/946,066, filed on Dec. 10, 2019.

(51) Int. Cl.
| | |
|---|---|
| *H01L 23/498* | (2006.01) |
| *H01L 23/64* | (2006.01) |
| *H01L 49/02* | (2006.01) |
| *H01L 23/00* | (2006.01) |
| *H01L 21/8234* | (2006.01) |
| *H01L 21/48* | (2006.01) |

(52) U.S. Cl.
CPC .... *H01L 23/49844* (2013.01); *H01L 21/4853* (2013.01); *H01L 21/8234* (2013.01); *H01L 23/49811* (2013.01); *H01L 23/642* (2013.01); *H01L 24/45* (2013.01); *H01L 24/85* (2013.01); *H01L 28/60* (2013.01); *H01L 2924/13064* (2013.01)

(58) Field of Classification Search
CPC ......................... H01L 23/49844; H01L 23/495
See application file for complete search history.

(56) References Cited

U.S. PATENT DOCUMENTS

| | | | |
|---|---|---|---|
| 5,870,291 | A | 2/1999 | Farrington et al. |
| 7,589,590 | B2 | 9/2009 | Pyykonen |
| 7,751,207 | B2 | 7/2010 | Schreiber et al. |
| 9,077,335 | B2 | 7/2015 | Hughes et al. |
| 2012/0181996 | A1* | 7/2012 | Gehrke ................. H01L 23/495 323/271 |

(Continued)

*Primary Examiner* — Yu-Hsi D Sun
(74) *Attorney, Agent, or Firm* — Ronald O. Neerings; Charles A. Brill; Frank D. Cimino (57) ABSTRACT

An integrated circuit (IC) package includes a substrate having a first region and a second region. The substrate includes a conductive path between the first region and the second region. The IC package also includes a lead frame having a first member and a second member that are spaced apart. The IC package further includes a half-bridge power module. The half-bridge power module includes a capacitor having a first node coupled to the first member of the lead frame and a second node coupled to the second member of the lead frame. The half-bridge power module also includes a high side die having a high side field effect transistor (FET) embedded therein and a low side die having a low side FET embedded therein. A source of the high side FET is coupled to a drain of the low side FET through the conductive path of the substrate.

20 Claims, 9 Drawing Sheets

(56) References Cited

U.S. PATENT DOCUMENTS

2014/0299982 A1\* 10/2014 Minamio .............. H01L 25/162
257/712
2019/0044446 A1    2/2019 Fuhrmann et al.
2021/0202357 A1\*  7/2021 Poddar .................... H01L 24/43

\* cited by examiner

IC PACKAGE WITH HALF-BRIDGE POWER MODULE

CROSS-REFERENCE TO RELATED APPLICATION

This application claims the benefit of priority to U.S. Provisional Application No. 62/946,066 filed on 10 Dec. 2019, the entirety of which is incorporated herein by reference.

TECHNICAL FIELD

This disclosure relates to integrated circuit (IC) packages, and more particularly, to an IC package that implements a half-bridge power module.

BACKGROUND

A high-electron-mobility transistor (HEMT), also known as heterostructure field effect transistor (HFET) or modulation-doped field effect transistor (MODFET), is a field-effect transistor (FET) incorporating a junction between two materials with different band gaps (e.g., a heterojunction) as the channel instead of a doped region (in contrast to a metal-oxide semiconductor FET (MOSFET)). HEMTs commonly use a material combination of gallium nitride (GaN) and aluminum gallium nitride (AlGaN), though there is wide variation, dependent on the application of the device. Like other FETs, HEMTs are used in integrated circuits as digital on-off switches. HEMTs are also used as amplifiers for large amounts of current using a small voltage as a control signal. Both of these uses are made possible by the unique current-voltage characteristics of HEMTs. HEMT are able to operate at higher frequencies than other transistors, up to millimeter wave frequencies, and are used in high-frequency products such as cell phones, satellite television receivers, voltage converters, and radar equipment. HEMTs are employed in satellite receivers and in power amplifiers.

Direct bonded copper (DBC) substrates are commonly used in power modules, because of the high thermal conductivity. DBCs are composed of a ceramic tile (commonly alumina) with a sheet of copper bonded to one or both sides by a high-temperature oxidation process. The top copper layer can be pre-formed prior to firing or chemically etched using printed circuit board technology to form an electrical circuit, while the bottom copper layer is usually kept plain. The substrate is attached to a heat spreader by soldering the bottom copper layer to the substrate.

Lead frames are the metal structures inside a chip package that carry signals from the die to the outside. A die inside the package is typically glued to the lead frame, and then bond wires attach the die pads to the leads. In the last stage of the manufacturing process, the lead frame is molded in a plastic case, and outside of the lead frame is cut-off.

SUMMARY

A first example relates to an integrated circuit (IC) package that includes a substrate having a first region and a second region, wherein the substrate includes a conductive path between the first region and the second region. The IC package also includes a lead frame that includes a first member and a second member that are spaced apart. The IC package further includes a half-bridge power module having a capacitor having a first node coupled to the first member of the lead frame and a second node coupled to the second member of the lead frame. The half-bridge power module also includes a high side die having a high side field effect transistor (FET) embedded therein and a low side die having a low side FET embedded therein. A source of the high side FET is coupled to a drain of the low side FET through the conductive path between the first region and the second region of the substrate and drain of the high side FET and a source of the low side FET are coupled to the capacitor.

A second example relates to an IC package. The IC package includes a substrate having a first region and a second region. The substrate includes a conductive path between the first region and the second region. The IC package includes a lead frame having a first member and a second member that are spaced apart. The IC package further includes a half-bridge power module having a capacitor having a first node coupled to the first member of the lead frame and a second node coupled to the second member of the lead frame. The half-bridge power module also includes a high side die having a plurality of a high side FETs embedded therein. The half-bridge power module further includes a low side die having a plurality of low side FETs embedded therein. A source of each high side FET in the plurality of high side FETs is coupled to a drain of a respective low side FET of the plurality of low side FETs through the conductive path between the first region and the second region of the substrate and a drain of each high side FET in the plurality of high side FETs and a source of each low side FET in the plurality of low side FETs are coupled to the capacitor.

A third example relates to a method for forming an IC package. The method includes adhering a high side die and a low side die to a substrate, wherein the high side die includes a plurality of high side FETs and the low side die includes a plurality of low side FETs. The method also includes adhering a lead frame to the substrate, the lead frame having a first member and a second member that are spaced apart. The method further includes adhering a capacitor to the lead frame, such that the capacitor extends in a plane that is parallel from a planer surface of the substrate. The method yet further includes applying wire bonding to couple a source of each high side FET in the plurality of high side FETs to a drain of a respective low side FET of the plurality of low side FETs and to couple a drain of each high side FET in the plurality of high side FETs and a source of each low side FET in the plurality of low side FETs to the capacitor.

DETAILED DESCRIPTION

This disclosure relates to an integrated circuit (IC) package that includes components for a half-bridge power module. The IC package include a substrate having a first region and a second region, and the substrate includes a conductive path between the first region and the second region. In some examples, the substrate has a planer surface. The IC package has a lead frame with a first member and a second member that are spaced apart from each other.

The half-bridge power module includes a capacitor with a first node coupled to the first member of the lead frame and a second node coupled to the second member of the lead frame. The power module of the IC package also includes a high side die having a plurality of a high side field effect transistors (FETs) embedded therein and a low side die having a plurality of low side FETs embedded therein. The IC package is configured such that a source of each high side FET in the plurality of high side FETs is coupled to a drain of a respective low side FET of the plurality of low side FETs through the conductive path between the first region and the second region of the substrate. The lead frame and the capacitor extend in a plane parallel to a planer surface of the substrate. In one orientation, the capacitor superposes the substrate.

Additionally, a drain of each high side FET in the plurality of high side FETs and a source of each low side FET in the plurality of low side FETs are coupled to the plurality of capacitors. The capacitors are situated in close proximity to the high side FET and the low side FET. In this manner, during operation, a three-dimensional (3D) power loop with reduced parasitic inductance is established in the half-bridge power module. The 3D power loop design provides a short loop length, and provides a current path to make anti-parallel electrical current directions for cancellation (or curtailment) of parasitic inductance.

Figure 1:
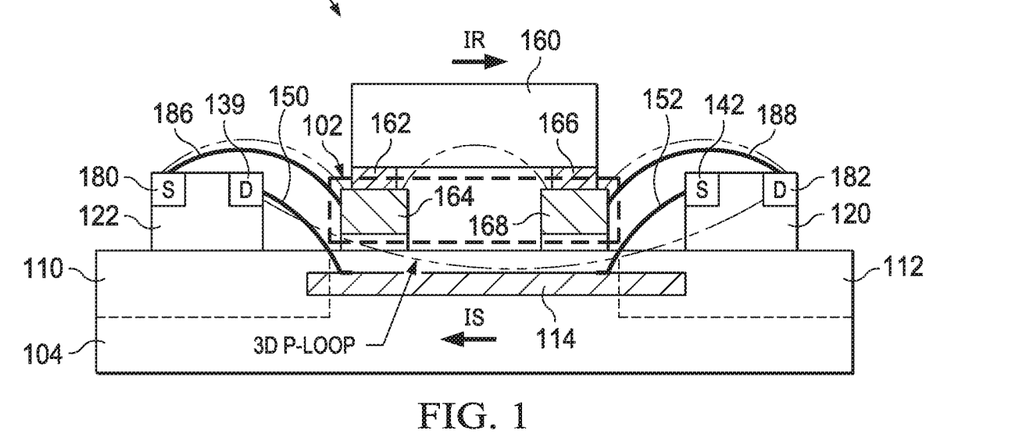
FIG. 1 illustrates a diagram of an example of an integrated circuit (IC) package for a half-bridge power module.
Figure 2:
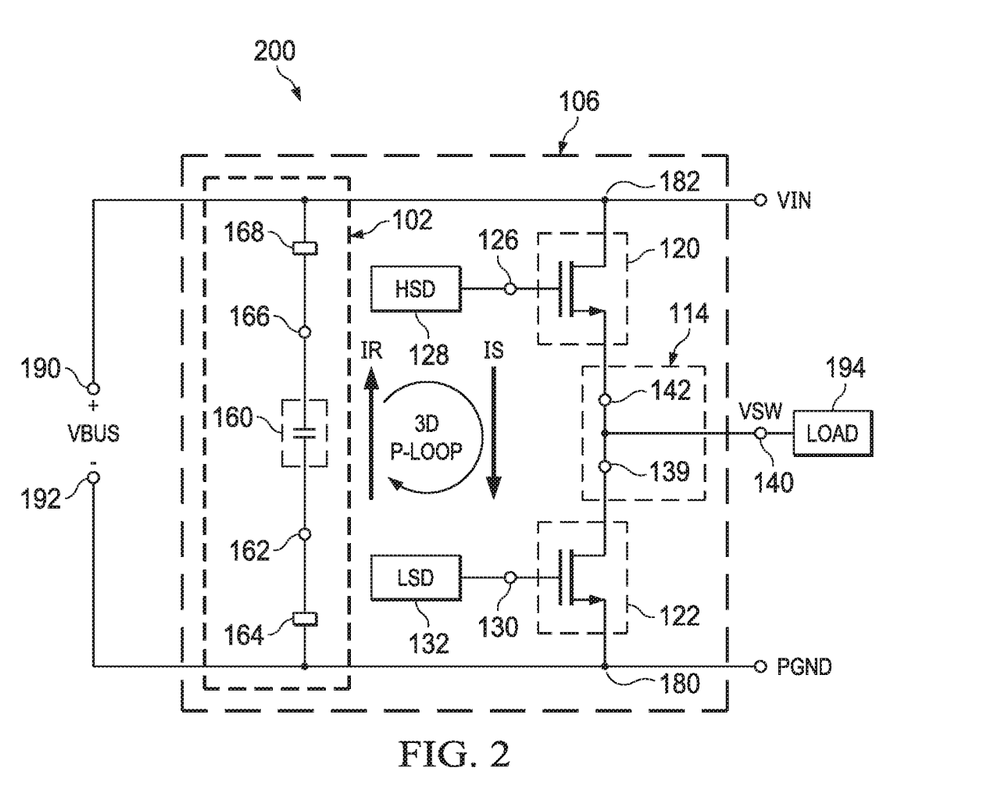
FIG. 2 illustrates a circuit diagram for the power module formed by the IC package of FIG. 1.

FIG. 1 illustrates a diagram of an example of an IC package 100 in a condition for completing packaging. FIG. 2 illustrates a circuit diagram 200 for the IC package 100 of FIG. 1. For purposes of simplification of explanation, FIGS. 1 and 2 employ the same reference numbers to denote the same structure.

The IC package 100 employs bonding techniques to bond the components of the IC package 100 to a lead frame 102 that extends in a plane parallel to a planer surface of a substrate 104. In one orientation, the lead frame 102 superposes the planer surface of the substrate 104. The lead frame 102 refers to a structure of an IC package that carries signals between dies of the IC package and external components or other internal components. As one example, the lead frame 102 is employable for lead of Dual In line Package (DIP) or other types of IC packages. The substrate 104 is implemented as a direct copper bonding substrate (DBC). In other examples, other types of substrates are employable.

The IC package 100 includes components to implement a half-bridge power module 106 (illustrated in FIG. 2) for a power control system, which alternatively may be referred to as a power module. In some examples, the IC package 100 also includes other modules. The half-bridge power module 106 is employable as a direct current (DC) to DC converter or as a DC to alternating current (AC) converter (e.g., alternatively referred to as an inverter). In some examples, the half-bridge power module 106 is employable to convert an DC signal with power of up to about 10 kilowatts (kW) into a DC signal with a lower average power.

The substrate 104 includes a first region 110 and a second region 112. Moreover, the substrate 104 includes a conductive path 114 (e.g., a trace) that connects the first region 110 of the substrate 104 to the second region 112 of the substrate 104.

The half-bridge power module 106 includes a high side field effect transistor (FET) 120 and a low side FET 122. In some examples, the high side FET 120 and the low side FET 122 are implemented as high-electron-mobility transistor (HMETs), such as gallium nitride (GaN) FETs with a switching time of about 10 nanoseconds (ns) or less. The high side FET 120 is embedded in a high side die and the low side FET 122 is embedded in a low side die. A gate node 126 of the high side FET 120 is coupled to an output of a high side driver 128 (labeled HSD in FIG. 2) and a gate node 130 of the low side FET 122 is coupled to a low side driver 132 (labeled LSD in FIG. 2). In the present example, it is presumed that the high side driver 128 and the low side driver 132 are implemented as isolation drivers. However, in other examples, other types of drivers are employable. In some examples, the high side driver 128 and the low side driver 132 are external components that are coupled to the IC package 100. In other examples, the high side driver 128 and the low side driver 132 are integrated with the IC package 100.

A drain node 139 of the low side FET 122 is coupled to a source of the high side FET 120 through the conductive path 114 on the substrate 104 that connects the first region 110 of the substrate 104 with the second region 112 of the substrate 104. The drain node 139 of the low side FET 122 is connected to the conductive path 114 through a first wire bond 150 and the source node 142 of the high side FET 120 is coupled to the conductive path 114 through a second wire bond 152.

A capacitor 160 is coupled to the lead frame 102. In some examples, the capacitor 160 has a capacitance within a range of 0.01 micro-Farads (µF) to 1 µF. More particularly, a first node 162 of the capacitor 160 is coupled to a first member 164 of the lead frame 102 and a second node 166 of the capacitor 160 is coupled to a second member 168 of the lead frame 102. Additionally, a source node 180 of the low side FET 122 is coupled to the first node 162 of the capacitor 160 through the first member 164 to the lead frame 102. Further, a drain node 182 of the high side FET 120 is coupled to the second node 166 of the capacitor 160 through the second member 168 of the lead frame 102. The source node 180 of the low side FET 122 is coupled to the first member 164 of the lead frame 102 with a third wire bond 186 and the drain node 182 of the high side FET 120 is coupled to the second member 168 of the lead frame 102 with a fourth wire bond 188.

The drain node 182 of the high side FET 120 is configured to be coupled to an input voltage (labeled as VIN in FIG. 2) and the source node 180 of the low side FET 122 is configured to be coupled to an electrically neutral node, such as a power ground (labeled as PGND in FIG. 2). Further, the node coupling the drain node 139 of the low side FET 122 with the source node 142 of the high side FET 120 is configured to be coupled to a switching voltage node 140 (labeled as VSW in FIG. 2). Additionally, the drain node 182 of the high side FET 120 is configured to be coupled to a positive bus voltage node 190 of a bus voltage source, labeled as VBUS in FIG. 2. Similarly, the source node 180 of the low side FET 122 is configured to be coupled to a negative bus voltage node 192 of the bus voltage, VBUS. In some examples, the bus voltage source is a DC voltage source that has a voltage of about 400 V or more.

In operation, the half-bridge power module 106 converts the bus voltage, VBUS into the switching voltage, VSW, which is provided at the switching voltage node 140. In some examples, the switching voltage, VSW is less than the bus voltage, VBUS. In other examples, the switching voltage, VSW is greater than the bus voltage, VBUS. Moreover, the switching voltage node 140 is configured to be coupled to a load 194 illustrated in FIG. 2, such as a resistive and/or reactive load. In the present example, it is presumed that the load 194 is implemented as an inductor. Accordingly, the switching voltage, VSW at the switching voltage node 140 induces a current, I-LOAD to the load 194. In some examples, the load 194 is external to the IC package 100.

Figure 3:
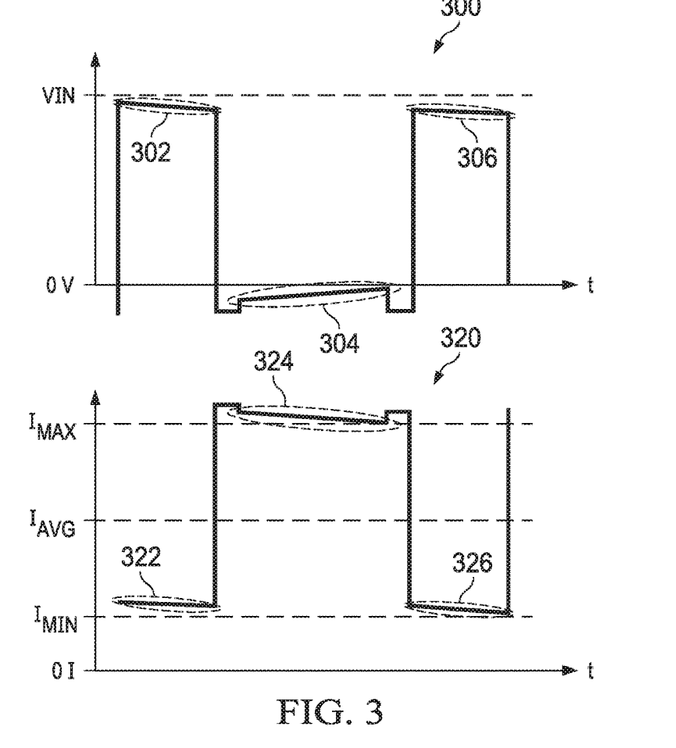
FIG. 3 illustrates a graph of an example waveform output by the half-bridge power module of the IC package of FIG. 1.

FIG. 3 illustrates an example of a graph 300 that plots the switching voltage, VSW at the switching voltage node 140 of FIG. 2 as a function of time and graph 320 that plots a current from the switching voltage node 140 and through the load 194 of FIG. 2 as the same function of time. As illustrated, the voltage and the current are in anti-phase with respect to each other. In the present example, it is presumed that the output of the high side driver 128 and the low side driver 132 are complementary square waves. As denoted by the reference 302 in the graph 300, a rising edge on the signal output by the high side driver 128 to the gate node 126 of the high side FET 120 induces a voltage of about the input voltage, VIN at the switching voltage node 140. During this time, as indicated by the reference 322 in the graph 320, the current output to the load 194 of FIG. 2 is about a minimum current, IMIN.

Additionally, as illustrated in the graph 300, upon a falling edge of the output of the high side driver 128, the signal output by the low side driver 132 that is provided to the gate node 130 of the low side FET 122 rises, and the voltage at switching voltage node 140 is about 0, as indicated by the reference 304. Moreover, the falling edge of the output of the high side driver 128 results in a rise of the current to the maximum current, IMAX as indicated by the reference 324. Additionally, during a next high pulse of the signal output by the high side driver 132 and a next low signal of the signal output by the low side driver 132 the switching voltage node 140 returns to the input voltage, VIN as indicated by the reference 306 and the current output to the load 194 reduces from about the maximum current IMAX, to about the minimum current, INN as indicated by the reference 326. Moreover, this cycle repeats for the voltage and current of the switching voltage node 140.

Referring back to FIGS. 1 and 2, the switching rate of the power provided to the load 194 is limited by an power loss of from energy conversion, FLOSS. The power loss, FLOSS can be estimated with Equation 1.

$$P_{LOSS} \approx SW_{Loss} + RDSon_{Loss} + Driver_{Loss} \quad \text{Equation 1}$$

Wherein:

$SW_{Loss}$ is the switching loss, which characterizes the power loss for switching an operational state of the high side FET 120 and the low side FET 122;

$RDSon_{Loss}$ is the drain-to-source power loss, which characterizes power loss for current passing through the drain-to-source of the high side FET 120 and the low side FET 122; and $Driver_{Loss}$ is the power loss by the high side driver 128 and the low side driver 132.

Furthermore, the length between the source node 180 of the low side FET 122 and the negative bus voltage node 192 induces a parasitic inductance, $L_P$. The parasitic inductance, $L_P$ induces a switching noise equal to $L_P*(di/dt)$, wherein the switching speed of the high side FET 120 and the low side FET 122 defines the rate of change of the current to the load 194, di/dt. Moreover, the switching loss, $SW_{Loss}$ is proportional to the switching noise. Thus, the switching loss $SW_{Loss}$ is proportional to the parasitic inductance, $L_P$ and the rate of change of the current to the load 194, di/dt. Accordingly, as the switching rate of the high side FET 120 and the low side FET 122 increases, the switching loss, $SW_{Loss}$ also increases. Moreover, as noted, in some examples, the high side FET 120 and the low side FET 122 are implemented as HEMTs. In such a situation, the high side FET 120 and the low side FET 122 have fast switching times, such as switching times of about 1 to about 10 nanoseconds.

The capacitor 160 (operating as a bypass capacitor) compensates for the parasitic inductance, $L_P$. In this manner, a three-dimensional (3D) power loop, labeled 3D P-LOOP in FIGS. 1 and 2 for current flowing through the half-bridge power module 106 is established. The 3D power loop, 3D P-LOOP includes a current passing through the drain-to-source of the high side FET 120 and the low side FET 122, which can be referred to as a switching current, IS and a current flowing through the capacitor 160, which can be referred to as a return current, IR. As illustrated in FIG. 2, the switching current, IS and the return current flow, IR in opposite, parallel directions, reducing or canceling stray magnetic fields induced from the switching current IS and the return current, IR thereby reducing the parasitic inductance, $L_P$. Further still, the first wire bond 150 and the third wire bond 186 along with the second wire bond 152 and the fourth wire bond 188 also extend in parallel, with current flowing in opposite directions to reduce or cancel stray magnetic fields and further reducing the parasitic inductance, $L_P$. In some examples, the parasitic inductance is reduced to about 1.7 nano-Henries (nH) or less.

Furthermore, by situating the capacitor 160 on the lead frame 102, the capacitor 160 is kept in close proximity with the high side FET 120 and the low side FET 122. Additionally, situating the capacitor 160 on the lead frame 102 rather than embedding the capacitor 160 in the substrate 104 avoids the need for a multi-layer substrate, while still maintaining the 3D power loop. Stated differently, the substrate 104 may be implemented as a single layer substrate, such as a DBC, because the capacitor 160 extends in a plane parallel (e.g., superposes in one orientation) to the conductive path 114 formed on a planer surface of the substrate 104. Accordingly, the IC package 100 improves operational performance of the half-bridge power module 106 without increasing complexity.

Figure 4:
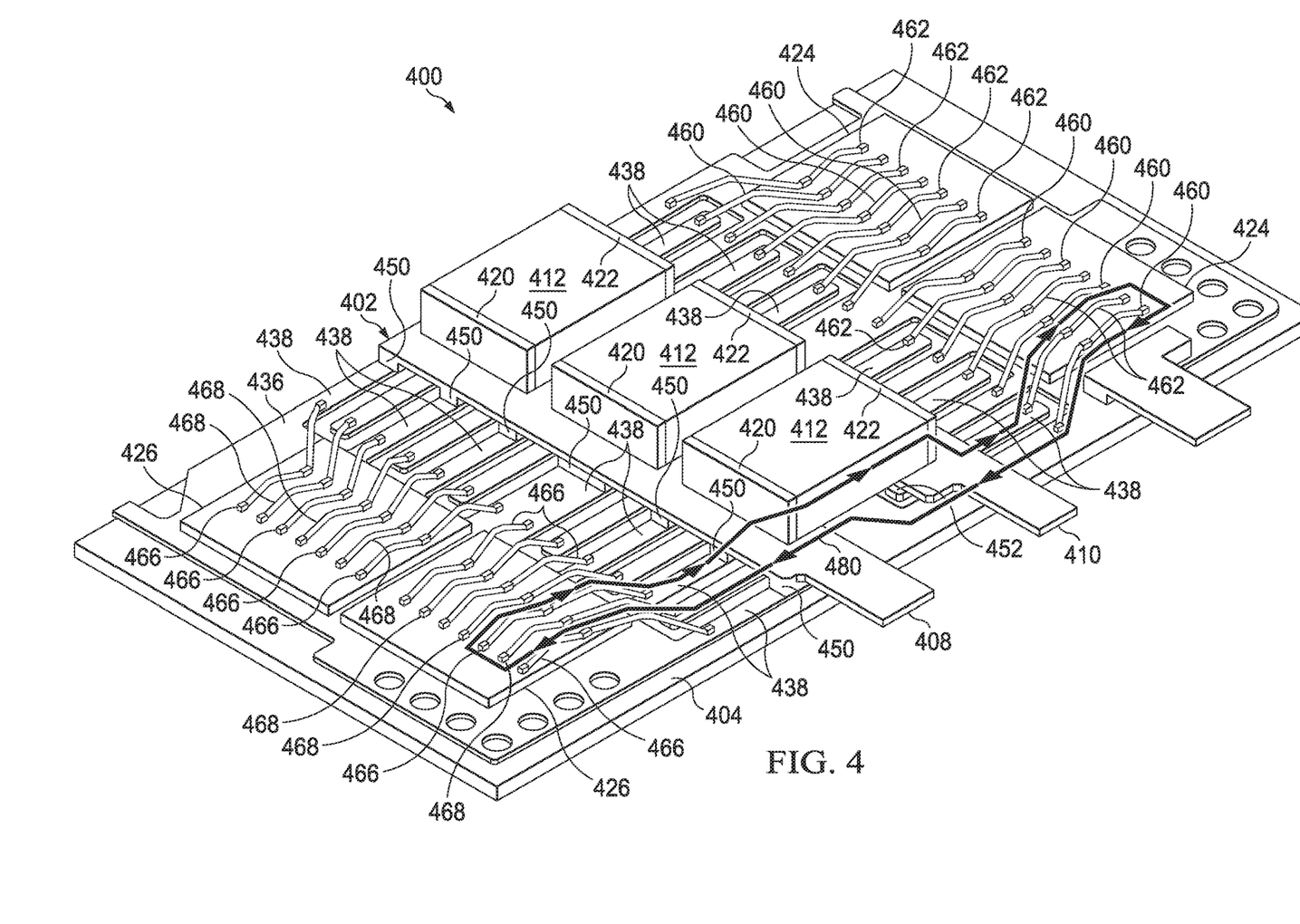
FIG. 4 illustrates another example of an IC package for a half-bridge power module.

FIG. 4 illustrates an example of an IC package 400 that is employable to implement the IC package 100 of FIG. 1. The IC package 400 employs bonding techniques to bond the components of the IC package to a lead frame 402 that extends in a plane parallel to a planer surface of a substrate 404. As one example, the lead frame 402 is employable for a DIP IC package or other types of IC packages. The substrate 404 is implemented as a DBC substrate. In other examples, other types of substrates are employable.

The lead frame 402 includes a first member 408 and a second member 410 that are spaced apart and extend in parallel. A plurality of capacitors 412 are coupled to the first member 408 and the second member 410 of the lead frame 402. More particularly, each capacitor 412 includes a first node 420 coupled to the first member 408 and a second node 422 coupled to the second member 410. Moreover, although the example illustrated in FIG. 4 includes three (3) capacitors 412, in other examples, there could be more or less capacitors 412.

The IC package 400 includes components to implement a half-bridge power module (illustrated in FIG. 2) for a power control system. In some examples, the IC package 400 also includes other modules. The half-bridge power module is employable as a DC to DC converter or as a DC to AC converter. In some examples, the half-bridge power module 106 is employable to convert a DC signal with up to about 10 kW of power The IC package 400 includes a set of high side dies 424 and a set of low side dies 426. In the example illustrated in FIG. 4, there are two high side dies 424 and two low side dies 426. However, in other examples, there could be more or less high side dies 424 and low side dies 426. Additionally, in some examples, the set of high side dies 424 and the set of low side dies 426 are representative of connection pads for one integrated high side die 424 and one integrated low side die 426. Each high side die 424 includes a plurality of high side FETs embedded therein. In some examples, each high side FET embedded in a corresponding high side die 424 is implemented in a manner similar to the high side FET 120 of FIGS. 1 and 2. Thus, in some examples, each high side FET embedded in the corresponding high side die 424 is implemented as a HEMT. Similarly, each low side die 426 includes a plurality of low side FETs embedded therein. In some examples, each low side FET embedded in a corresponding low side die 426 is implemented in a manner similar to the low side FET 122 of FIGS. 1 and 2. Thus, in some examples, each low side FET embedded in the corresponding high side die 424 is implemented as a HEMT.

Figure 5:
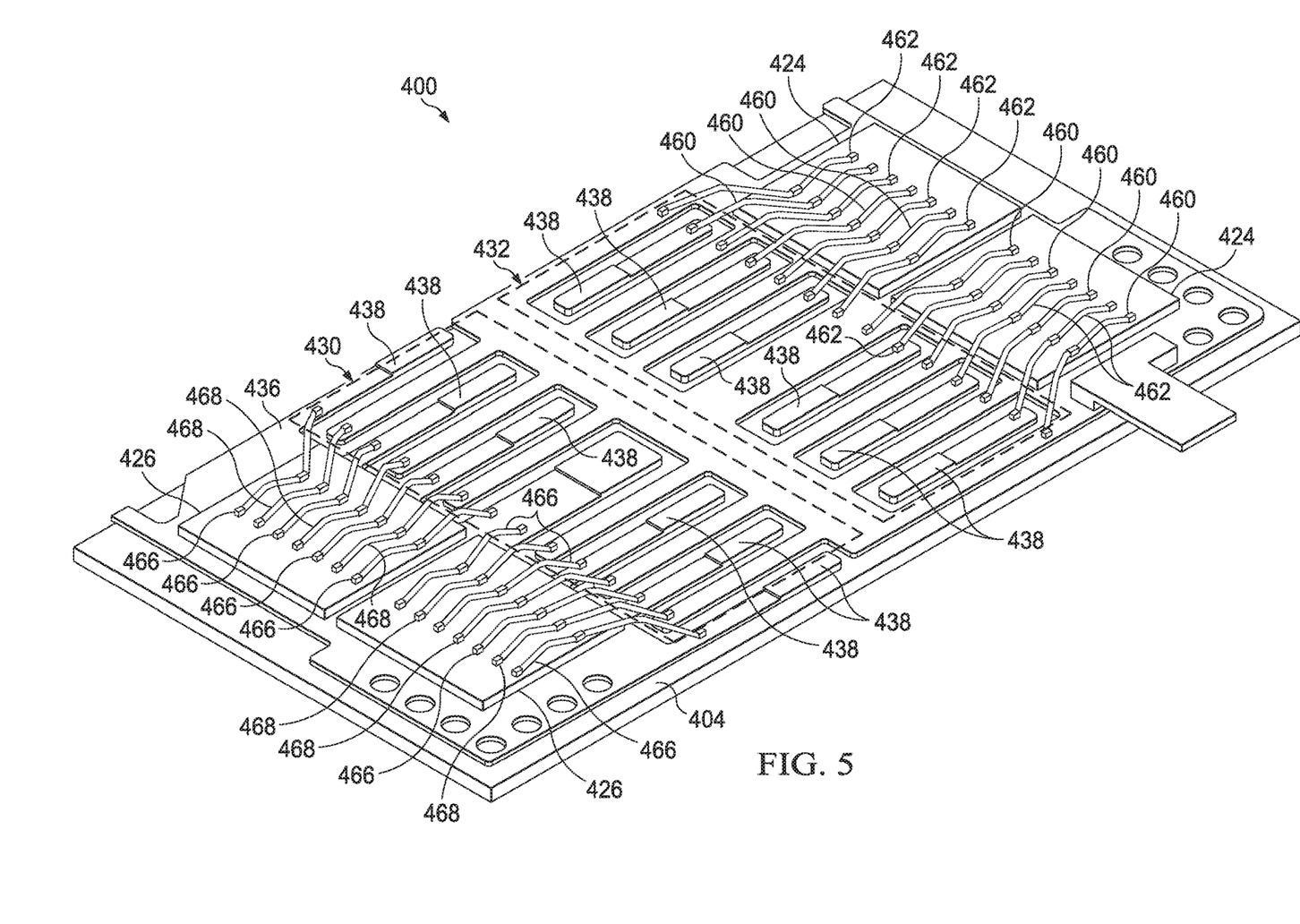
FIG. 5 illustrates a portion of the IC package illustrated in FIG. 4.

FIG. 5 illustrates the IC package 400 of FIG. 4, wherein the plurality of capacitors 412 and the lead frame 402 has been removed to reveal portions of the substrate 404. FIGS. 4 and 5 employ the same reference numbers to denote the same structure. Additionally, some reference numbers are not reintroduced and some reference numbers are not included in both FIGS. 4 and 5.

The substrate 404 includes a first region 430 and a second region 432. As illustrated in FIG. 4, the first member 408 of the lead frame 402 is adhered to the first region 430 of the substrate 404 (e.g., with solder paste) and the second member 410 of the lead frame 402 is adhered to the second region 432 of the substrate 404 (e.g., with solder paste). The substrate 404 includes a pattern 436 that provides a conductive path between the first region 430 and the second region 432 of the substrate 404. The pattern 436 has a double sided comb shape. The substrate 404 also includes a plurality of traces 438 (e.g., rectangular patterns). A first subset of the traces 438 are within the first region 430 of the substrate 404 and a second subset of the traces 438 are within the second region 432 of the substrate 404. Each of the traces 438 are spaced apart from the pattern 436. As illustrated in FIG. 4, the first member 408 of the lead frame 402 includes pillars 450 that each adhered (e.g., with solder paste) to a corresponding one of the first subset of traces 438 that are within the first region 430 of the substrate 404. Similarly, the second member 410 of the lead frame 402 includes pillars 452 (only one of which is labeled) that are each adhered (e.g., with solder paste) to a corresponding one of the second subset of traces 438 that are within the second region 432 of the substrate 404.

As illustrated in FIG. 5, each of the traces 438 are interleaved with extensions of the double comb shaped pattern 436. Additionally, each high side die 424 includes a first plurality of wire bonds 460 that extend from a source of a respective embedded FET and extends to the first pattern 436 of the substrate 404. Each high side die 424 also includes a second plurality of wire bonds 462 that each extend from a drain of a respective embedded FET and extend to a trace 438 of the substrate 404. In this manner, the first plurality of wire bonds 460 extend parallel to the second plurality of wire bonds 462.

Each low side die 426 includes a third plurality of wire bonds 466 that extend from a source of a respective embedded FET and extends to one of the traces 438 of the substrate 404. Each low side die 426 also includes a fourth plurality of wire bonds 468 that each extend from a drain of a respective embedded FET and extend to a trace 438 of the substrate 404. In this manner, the third plurality of wire bonds 466 extend parallel to the fourth plurality of wire bonds 468.

As illustrated in FIG. 5, the source of each respective FET on the high side die 424 is coupled to the drain of a respective FET of the low side die 426. In particular, a conductive path is established from the source of each respective FET on the high side die 424 which is coupled to the drain of a respective FET of the low side die 426 through one of the first plurality of wire bonds 460, the pattern 436 of the lead frame 102 and one of the fourth plurality of wire bonds 468.

Additionally, as illustrated in FIG. 4, the drain of each respective FET on the high side die 424 is coupled to the second node 422 of a capacitor 412. In particular, a conductive path is established from the drain of each respective FET on the high side die 424 to the second node 422 of a respective capacitor 412 through one of the second plurality of wire bonds 462 to one of the traces 438, through the second member 410 of the lead frame 402 and to the second node 422 of the respective capacitor 412. Further, the source of each respective FET on the low side die 426 is coupled to the first node 420 of a respective capacitor 412. In particular, a conductive path is established from the source of each respective FET on the low side die 426 to the first node 420 of a respective capacitor 412 through one of the third plurality of wire bonds 462 to one of the traces 438, through the first member 408 of the lead frame 402 and to the second node 422 of the respective capacitor 412.

Molding (e.g., plastic molding) can be applied to the IC package 400. The molding can cover the components of the IC chip package including each of the capacitors 412. Additionally, in some examples, components of the IC package 400 can be connected to other modules.

In operation, the half-bridge power module formed with the components of the IC package 400 operates in a manner similar to the half-bridge power module 106 of FIG. 2. In particular, as indicated by an arrow loop 480, current flows from a source of a respective FET in the high side die 424 to a drain of a respective FET in the low side die 426. The current also flows from the source to the drain of the respective FET in the low side die 426, through the first member 408 of the lead frame 402. The current continues through a respective capacitor 412, to the second member of the lead frame 402 and to the drain to the source of the respective FET of the high side die 424. Thus, as illustrated, the current flows in a 3D power loop, characterized by the arrow loop 480. By arranging the lead frame 402 in this manner relative to the substrate 404, each capacitor 412 can be kept in close physical proximity with the high side dies 424 and the low side dies 426, thereby curtailing parasitic inductance for a return path. Additionally, as illustrated by the direction of the arrows in the arrow loop 480, the current in adjacent components flows in opposite directions, thereby reducing or canceling out stray induced magnetic fields.

Further still, situating the capacitors 412 on the lead frame 402 rather than embedding the capacitors 412 in the substrate 404 avoids the need for a multi-layer substrate, while still maintaining the 3D power loop. Stated differently, the substrate 404 may be implemented as a single layer substrate, such as a DBC substrate because the capacitors 412 extends in a plane parallel to the conductive path formed on a planer surface of the pattern 436 of the substrate 404. Accordingly, the IC package 400 improves operational performance of the resultant half-bridge power module without increasing complexity.

Figure 6:
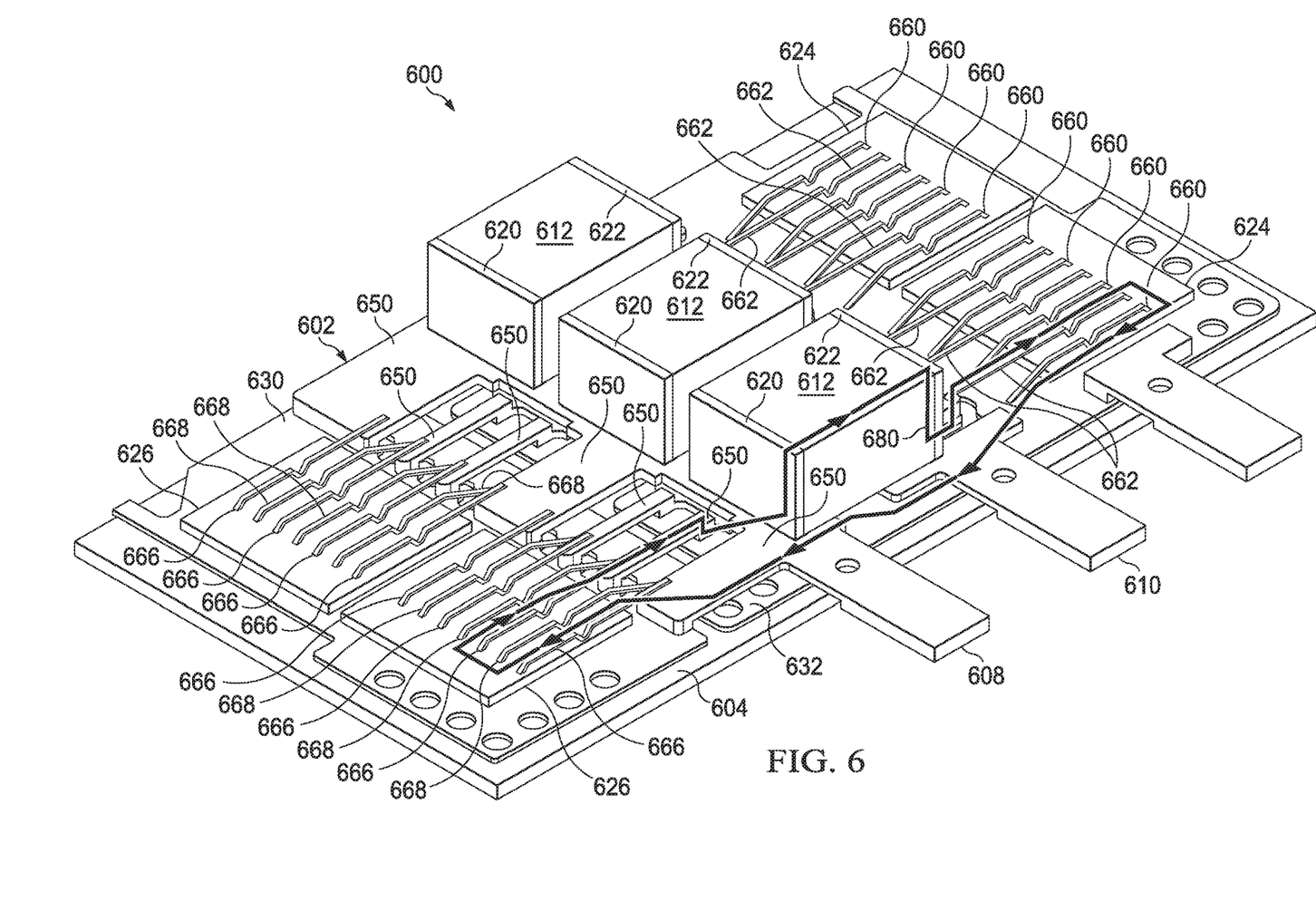
FIG. 6 illustrates yet another example of an IC package for a power module.

FIG. 6 illustrates an example of an IC package 600 that is employable to implement the IC package 100 of FIG. 1. The IC package 600 employs bonding techniques to bond the components of the IC package to a lead frame 602 that extends in a plane parallel to a substrate 604. As one example, the lead frame 602 is employable for a DIP IC package or other types of IC packages. The substrate 604 is implemented as a DBC substrate 604. In other examples, other types of substrates are employable.

The lead frame 602 includes a first member 608 and a second member 610 that are spaced apart and extend in parallel. A plurality of capacitors 612 are coupled to the first member 608 and the second member 610 of the lead frame 602. More particularly, each capacitor 612 includes a first node 620 coupled to the first member 608 and a second node 622 coupled to the second member 610. Moreover, although the example illustrated in FIG. 6 includes three (3) capacitors 612, in other examples, there could be more or less capacitors 612.

The IC package 600 includes components to implement a half-bridge power module (illustrated in FIG. 2) for a power control system. In some examples, other modules are also included in the IC package 600. The half-bridge power module is employable as a DC to DC converter or as a DC to AC converter. In some examples, the half-bridge power module formed by the IC package 600 is employable to convert an DC signal with a power up to about 10 kW.

The IC package 600 includes a set of high side dies 624 and a set of low side dies 626. In the example illustrated in FIG. 6, there are two high side dies 624 and two low side dies 626. However, in other examples, there could be more or less high side dies 624 and low side dies 626. Additionally, in some examples, the set of high side dies 624 and the set of low side dies 626 are representative of connection pads for one integrated high side die 624 and one integrated low side die 626. Each high side die 624 includes a plurality of high side FETs embedded therein. In some examples, each high side FET embedded in a corresponding high side die 624 is implemented in a manner similar to the high side FET 120 of FIGS. 1 and 2. Thus, in some examples, each high side FET embedded in the corresponding high side die 624 is implemented as a HEMT, such as a GaN FET. Similarly, each low side die 626 includes a plurality of low side FETs embedded therein. In some examples, each low side FET embedded in a corresponding low side die 626 is implemented in a manner similar to the low side FET 122 of FIGS. 1 and 2. Thus, in some examples, each low side FET embedded in the corresponding high side die 624 is implemented as a HEMT such as a GaN FET.

Figure 7:
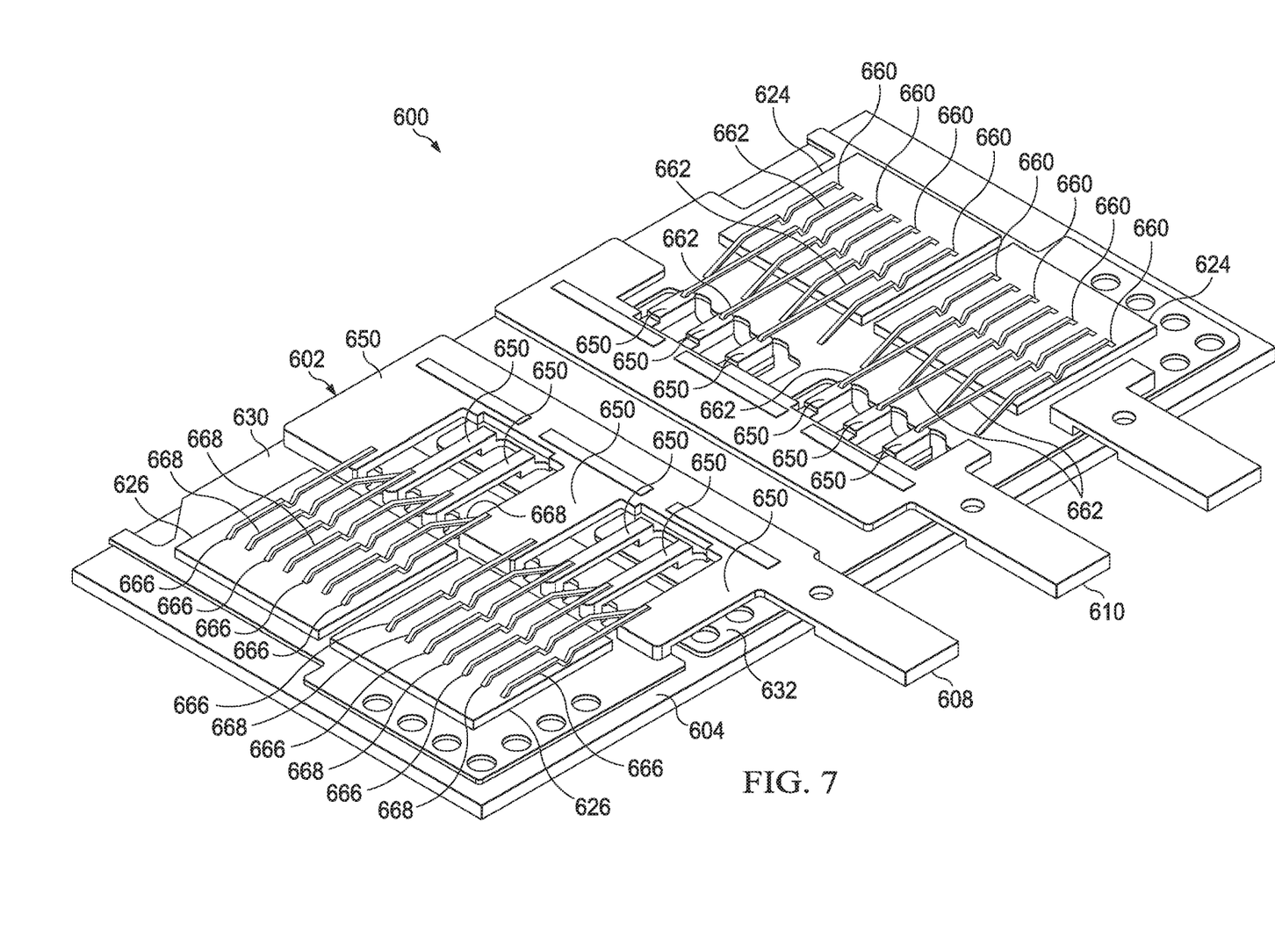
FIG. 7 illustrates a first portion the IC package illustrated in FIG. 6.
Figure 8:
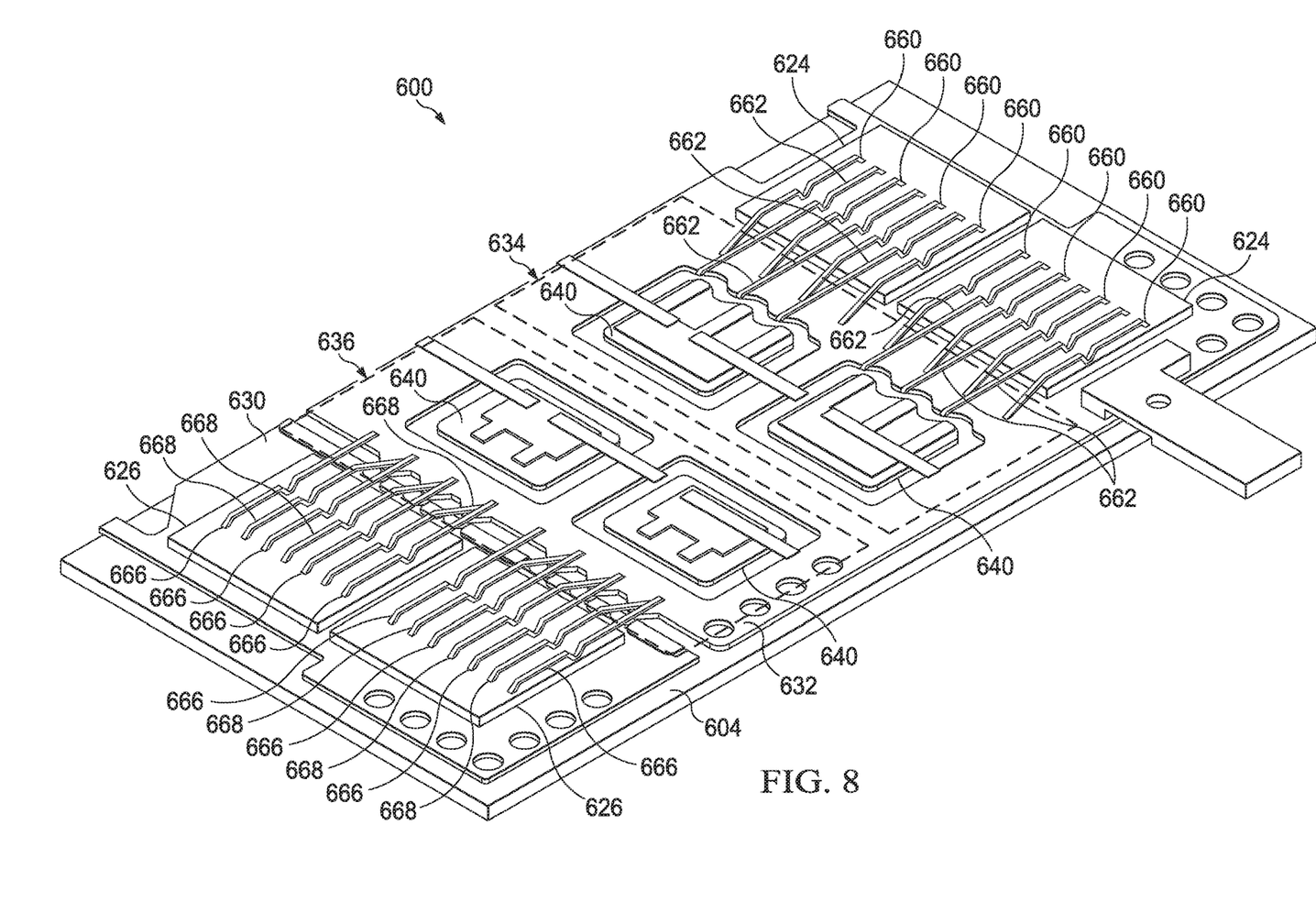
FIG. 8 illustrates a second portion the IC package illustrated in FIG. 6.

FIG. 7 illustrates the IC package 600 of FIG. 6, wherein the plurality of capacitors 612 have been removed to reveal portions of the lead frame 602 and the substrate 604. FIG. 8 illustrates the IC package 600 of FIG. 6, wherein the plurality of capacitors 612 and the lead frame 602 has been removed to reveal portions of the substrate 604. FIGS. 6-8 employ the same reference numbers to denote the same structure. Additionally, some reference numbers are not reintroduced and some reference numbers are not included in each of the FIGS. 6-8.

The substrate 604 includes a first pattern 630 and a second pattern 632. As illustrated in FIG. 6, the first member 608 of the lead frame 602 is adhered to the first pattern 630 of the substrate 604 with solder paste and the second member 610 of the lead frame 602 is adhered to the second pattern 632 of the substrate 604 with solder paste. The first pattern 630 and the second pattern 632 are spaced apart from each other. As illustrated in FIG. 8, the second pattern 632 includes a first region 634 and a second region 636 of the substrate 604. The second pattern 632 provides a conductive path between the first region 634 and the second region 636 of the substrate 604. Additionally, as illustrated in FIG. 7, substrate 404 includes a plurality of a floating pads 640. The floating pads 640 are circumscribed by the second pattern 632 of the substrate 604. Further, the floating pads 640 are spaced apart from the second pattern 632. The first member 608 and the second member 610 of the lead frame 602 are coupled to the floating pads 640 of the substrate 604.

As illustrated in FIG. 7, the first member 608 of the lead frame 602 includes a plurality of extensions 650 (some of which are hidden from view) that are each adhered (e.g., with solder paste) to a corresponding one of the first patterns 630 of the substrate 604 and the second pattern 632 of the substrate 604. Each of the extensions 650 are implemented as finger shaped members that extend away from a body of the lead frame and toward the first pattern 630 or the second pattern 632 of the substrate 604.

Each high side die 624 includes a first plurality of wire bonds 660 that extend from a source of a respective embedded FET and extend to the second pattern 632 of the substrate 604. Each high side die 624 also includes a second plurality of wire bonds 662 that each extend from a drain of a respective embedded FET and extend to a respective one of the plurality of extensions 650 on the second member 610 of the lead frame 602. Thus, each drain of the respective embedded FETS in the high side die 624 is coupled directly to the second member 610 of the lead frame 602 without passing through the substrate 604. Additionally, in this manner, the first plurality of wire bonds 660 extend parallel to the second plurality of wire bonds 662.

Each low side die 626 includes a third plurality of wire bonds 666 that extend from a source of a respective embedded FET and extend to a respective one of the plurality of extensions 650 on the first member 608 of the lead frame 602. Each low side die 626 also includes a fourth plurality of wire bonds 668 that each extend from a drain of a respective embedded FET and extend to the second pattern 632 of the substrate 604. In this manner, the third plurality of wire bonds 666 extend parallel to the fourth plurality of wire bonds 668.

As illustrated in FIG. 7, the source of each respective FET on the high side die 624 is coupled to the drain of a respective FET of the low side die 626. In particular, a conductive path is established from the source of each respective FET on the high side die 624 to the drain of a respective FET of the low side die 626 through one of the first plurality of wire bonds 660, the second pattern 632 of the lead frame 102 and one of the fourth plurality of wire bonds 668. Additionally, as illustrated in FIGS. 6 and 7, the drain of each respective FET on the high side die 624 is coupled to the second node 622 of a capacitor 612. In particular, a conductive path is established from the drain of each respective FET on the high side die 624 to the second node 622 of a respective capacitor 612 through one of the second plurality of wire bonds 662 to one of the extensions 650, through the second member 610 of the lead frame 602 and to the second node 622 of the respective capacitor 612. Further, the source of each respective FET on the low side die 626 is coupled to the first node 620 of a respective capacitor 612. In particular, a conductive path is established from the source of each respective FET on the low side die 626 to the first node 620 of a respective capacitor 612 through one of the third plurality of wire bonds 662 to one of the extensions 650, through the first member 608 of the lead frame 602 and to the first node 620 of the respective capacitor 612.

Molding can be applied to the IC package 600. The molding can cover the components of the IC package 600 including each of the capacitors 612. Additionally, in some examples, components of the IC package 600 can be connected to other modules.

In operation, the half-bridge power module formed with the components of the IC package 600 operates in a manner similar to the half-bridge power module 106 of FIG. 2. In particular, as indicated by an arrow loop 680, current flows from a source of a respective FET in the high side die 624 to a drain of a respective FET of the low side die 626. The current also flows from the source to the drain of the respective FET in the low side die 626, through the first member 608 of the lead frame 602. The current continues through a respective capacitor 612, to the second member of the lead frame 602 and to the drain to the source of the respective FET of the high side die 624. Thus, as illustrated, the current flows in a 3D power loop, characterized by the arrow loop 680. By arranging the lead frame 602 in this manner relative to the substrate 604, each capacitor 612 can be kept in close physical proximity with the high side dies 624 and the low side dies, thereby curtailing parasitic inductance for a return path. Additionally, as illustrated by the direction of the arrows in the arrow loop 680, the current in adjacent components flows in opposite directions, thereby reducing or canceling out induced stray magnetic fields.

Further still, situating the capacitors 612 on the lead frame 602 rather than embedding the capacitors 612 in the substrate 604 avoids the need for a multi-layer substrate, while still maintaining the 3D power loop. Stated differently, the substrate 604 may be implemented as a single layer substrate, such as a DBC substrate because the capacitors 612 extends in a plane parallel to a plane of the conductive path formed on the second pattern 632 of the substrate 604. Accordingly, the IC package 600 improves operational performance of the resultant half-bridge power module without increasing complexity.

As compared to the IC package 400 illustrated in FIGS. 4 and 5, the IC package 600 has an asymmetrical design with respect to the first pattern 630 and the second pattern 632 of the substrate 604, and the IC package 400 of FIGS. 4 and 5 has a symmetrical design of the pattern 436 of the substrate 404. The asymmetrical design of the IC package 600 allows improved electrical reliability especially for electro migration. In particular, the IC package 600 improves reliability as compared with the IC package 400 of FIGS. 4 and 5 because the high side dies 624 and the low side dies 624 are connected to the lead frame 602 without the need for conductive adhesive (e.g., soldering). Rather, the high side dies 624 and the low side dies 624 are connected to the lead frame 602 through a metal-to-metal wire bonding (e.g., aluminum to copper). Metal-to-metal direct bonding has elevated performance characteristics with respect to electro migration as compared with a conductive adhesive connection (e.g., soldering, silver sintering, silver-epoxy paste, etc.).

Figure 9:
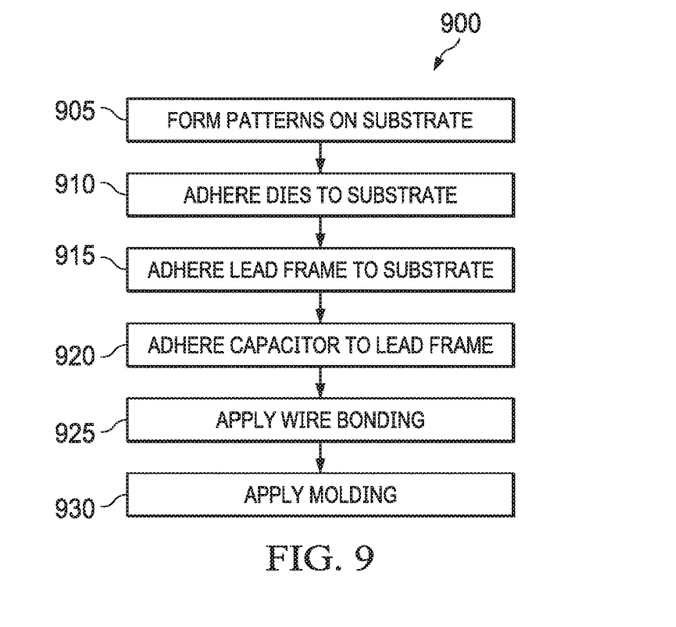
FIG. 9 illustrates a flowchart of an example method forming an IC package.

Conversely, the symmetrical design in the pattern 436 of the substrate 404 provides improved balance of heat dissipation between the high side dies 424 and the low side dies 426 of FIGS. 4 and 5. Additionally, the symmetrical design of the pattern 436 of the substrate 404 in the IC package 400 of FIG. 4 allows each high/low side source/drain wire bond loop shape (indicated by the arrow loop 480) to be designed to more accurately resemble an ideally shaped anti-parallel loop to further reduce the parasitic inductance as compared to the IC package 600. FIG. 9 illustrates a method 900 for forming an IC package. The method could be employed for example, to form the IC package 100 of FIG. 1, the IC package 400 of FIG. 4 and/or the IC package 600 of FIG. 6. Thus, the IC package can include a half-bridge power module, such as the half-bridge power module 106 of FIG. 2. The method 900 is demonstrated with FIGS. 10-14. FIGS. 10-14 illustrate stages of fabrication of the IC package 100 of FIG. 1. Moreover, FIGS. 1 and 10-14 employ the same reference numbers to denote the same structure.

Figure 10:
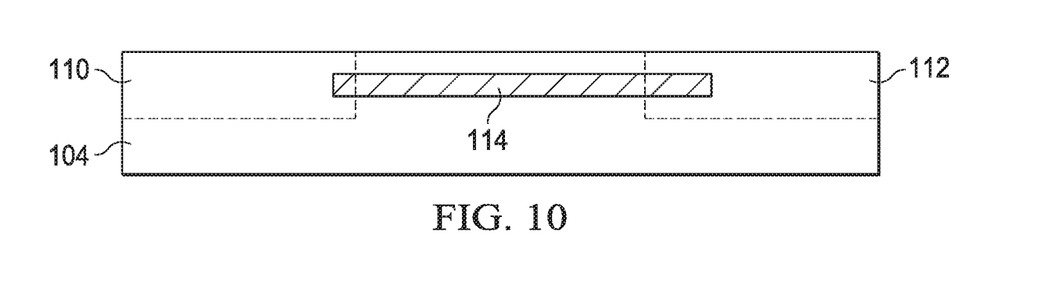
FIG. 10 illustrates a first stage of packaging for the IC package formed by the method of FIG. 9.

At 905, patterns are formed on a substrate (e.g., the substrate 104 of FIG. 1), as illustrated in FIG. 10. The patterns allow for placement of dies and a lead frame. The patterns include the conductive path 114 that provide communication between the first region 110 and the second region 112 of the substrate 604.

Figure 11:
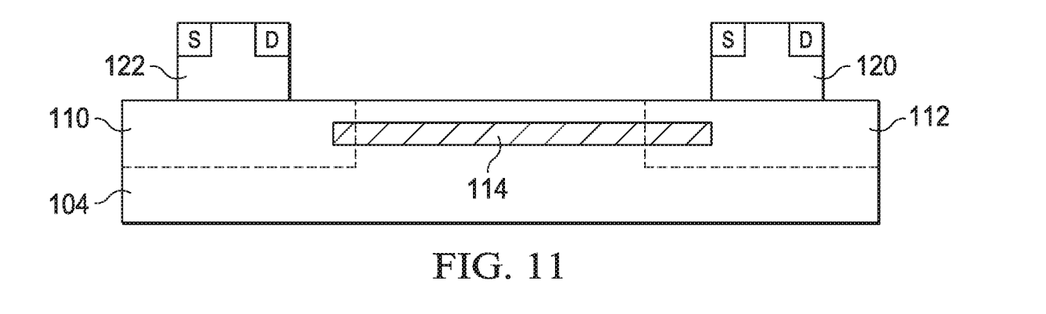
FIG. 11 illustrates a second stage of packaging for the IC package formed by the method of FIG. 9.
Figure 12:
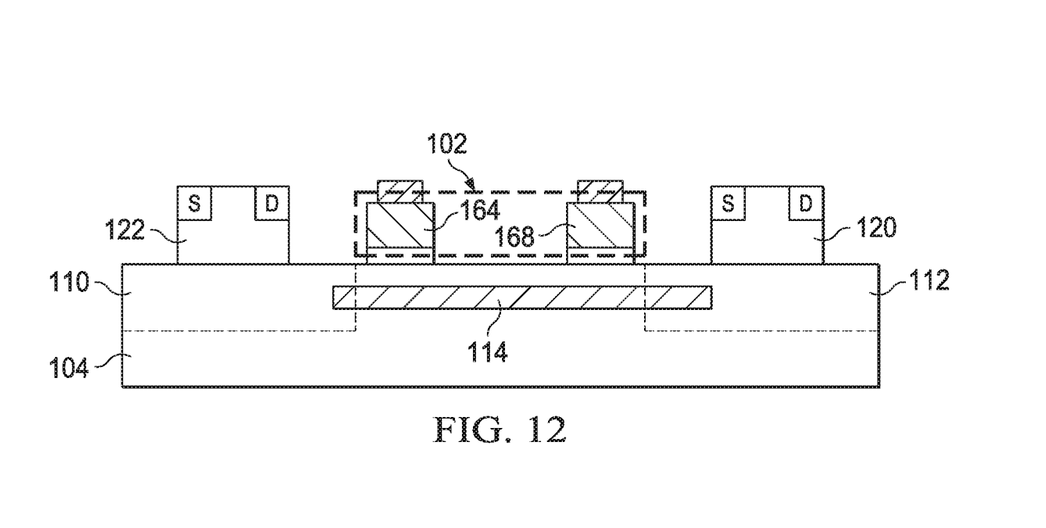
FIG. 12 illustrates a third stage of packaging for the IC package formed by the method of FIG. 9.
Figure 13:
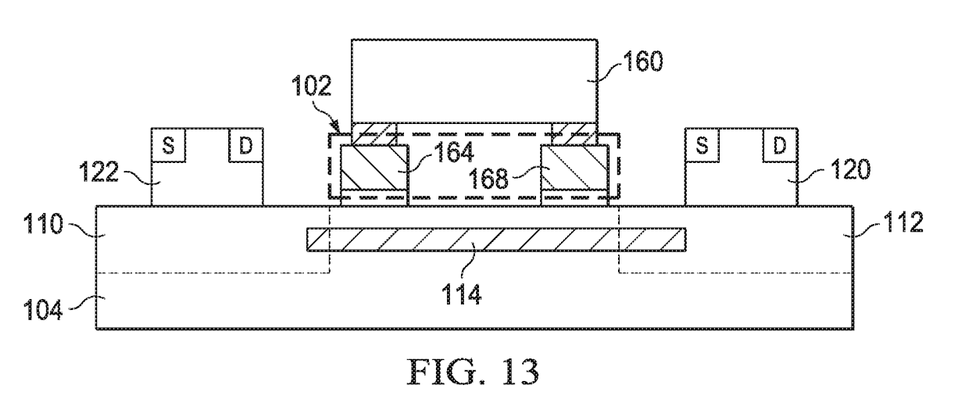
FIG. 13 illustrates a fourth stage of packaging for the IC package formed by the method of FIG. 9.

Referring back to FIG. 9, at 910, the dies are adhered to the second side of the first clip via a layer of solder paste. As illustrated in FIG. 11, the high side die include the high side FET 120 embedded therein. Similarly, the low side die includes the low side FET 122 embedded therein. Referring back to FIG. 9, at 915, a lead frame is adhered to the pattern of the substrate via solder paste. As illustrated in FIG. 12, the lead frame 102 include the first member 164 and the second member 168 that are spaced apart. Referring back to FIG. 9, at 920, a capacitor (e.g., the capacitor 160 of FIG. 1) is adhered (e.g., with solder paste) to the first member and the second member of the lead frame. As illustrated in FIG. 13, the capacitor 160 adhered (e.g., with solder paste) to the lead frame 102 is situated to extend in a plane parallel to a planer surface the substrate 104.

Figure 14:
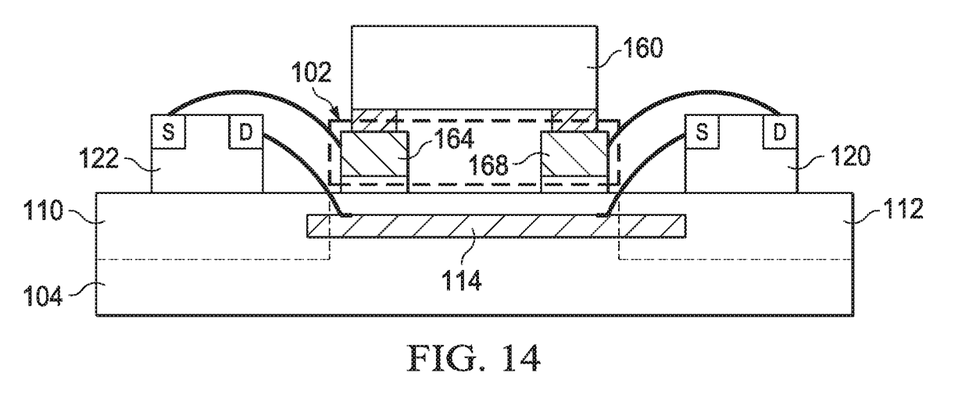
FIG. 14 illustrates a fifth stage of packaging for the IC package formed by the method of FIG. 9.

Referring back to FIG. 9, at 925, wire bonding is applied to couple the high side die and the low side die to the capacitor and the substrate. As illustrated in FIG. 14, application of the wire bonding allows formation of a 3D power loop (e.g., the 3D power loop characterized by the arrow loop 480 of FIG. 4 and/or the 3D power loop characterized by the arrow loop 680 of FIG. 6). Referring back to FIG. 9, at 930, molding is applied to the IC package to provide an IC chip that is employable as a half-bridge power module.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims.

What is claimed is:

1. An integrated circuit (IC) package comprising:
a substrate comprising a first region and a second region, wherein the substrate includes a conductive path between the first region and the second region;
a lead frame comprising a first member and a second member that are spaced apart; and
a half-bridge power module comprising:
a capacitor having a first node coupled to the first member of the lead frame and a second node coupled to the second member of the lead frame;
a high side die having a high side field effect transistor (FET) embedded therein;
a low side die having a low side FET embedded therein, wherein a source of the high side FET is coupled to a drain of the low side FET through the conductive path between the first region and the second region of the substrate and drain of the high side FET and a source of the low side FET are coupled to the capacitor.

2. The IC package of claim 1, wherein the substrate is a direct bonded copper (DBC) substrate.

3. The IC package of claim 2, wherein the high side die comprises a plurality of high side FETs and the low side die comprises a plurality of low side FETs, wherein a source of each of the high side FETs is coupled to a respective drain of a respective low side FET through the conductive path between the first region and the second region of the substrate and a drain of each of the plurality of high side FETs and a source of the plurality of low side FETs are coupled to the capacitor.

4. The IC package of claim 3, wherein the plurality of high side FETs and the plurality of low side FETs are high-electron mobility transistors.

5. The IC package of claim 1, wherein the source of the high side FET is coupled to the substrate with a first wire bond, and the drain of the low side FET is coupled to the substrate with a second wire bond.

6. The IC package of claim 5, wherein the drain of the high side FET is coupled to a trace on the substrate with a third wire bond, and the second member of the lead frame is adhered to the trace on the substrate.

7. The IC package of claim 6, wherein the trace is a first trace, and a source of the low side FET is coupled to a second trace on the substrate with a fourth wire bond, and the first member of the lead frame is adhered to the second trace on the substrate.

8. The IC package of claim 7, wherein the first wire bond and the third wire bond are parallel, and current flows in the first wire bond and the second wire bond in opposing directions such that stray magnetic fields induced by current flowing through the first wire bond and the second wire bond are reduced.

9. The IC package of claim 7, wherein the second wire bond and the fourth wire bond are parallel, and current flows in the second wire bond and the fourth wire bond in opposing directions such that stray magnetic fields induced by current flowing through the second wire bond and the fourth wire bond are reduced.

10. The IC package of claim 5, wherein the drain of the high side FET is coupled to an extension of the second member of the lead frame with a third wire bond.

11. The IC package of claim 10, wherein the extension is a first extension, and a source of the low side FET is coupled to a second extension on the first member of the lead frame with a fourth wire bond.

12. The IC package of claim 11, wherein the substrate comprises a first floating pad and a second floating pad, wherein the first member of the lead frame is adhered to the first floating pad and the second member of the lead frame is adhered to the second floating pad.

13. The IC package of claim 12, wherein the capacitor comprises a plurality of capacitors, and the plurality of capacitors extend in a plane parallel to planer surface of the substrate.

14. An integrated circuit (IC) package comprising:
a substrate comprising a first region and a second region, wherein the substrate includes a conductive path between the first region and the second region;
a lead frame comprising a first member and a second member that are spaced apart; and
a half-bridge power module comprising:
a capacitor having a first node coupled to the first member of the lead frame and a second node coupled to the second member of the lead frame, wherein the capacitor is mounted in a plane parallel to a planer surface of the substrate;
a high side die comprising a plurality of high side field effect transistors (FET) embedded therein; and
a low side die comprising a plurality of low side FETs embedded therein, wherein a source of each high side FET in the plurality of high side FETs is coupled to a drain of a respective low side FET of the plurality of low side FETs through the conductive path between the first region and the second region of the substrate and a drain of each high side FET in the plurality of high side FETs and a source of each low side FET in the plurality of low side FETs are coupled to the capacitor.

15. The IC package of claim 14, wherein each of the plurality of high side FETs and each of the plurality of low side FETs is a high-electron mobility transistor.

16. The IC package of claim 14, wherein the drain of each of the plurality of high side FETs is coupled to a respective trace of a plurality of traces on the substrate through a first plurality of wire bonds and the source of each of the plurality of low side FETs is coupled to a respective trace of the plurality of traces through a second plurality of wire bonds.

17. The IC package of claim 14, wherein the drain of each of the plurality of high side FETs is coupled to the second member of the lead frame through a first plurality of wire bonds and the source of each of the plurality of low side FETs are coupled to the capacitor through a second plurality of wire bonds.

18. A method for forming an integrated circuit (IC) package, the method comprising:
adhering a high side die and a low side die to a substrate, wherein the high side die comprises a plurality of high side field effect transistors (FETs) and the low side die comprises a plurality of low side FETs;
adhering a lead frame to the substrate, the lead frame having a first member and a second member that are spaced apart;
adhering a capacitor to the lead frame, such that the capacitor extends in a plane that is parallel from a planer surface of the substrate; and
applying wire bonding to couple a source of each high side FET in the plurality of high side FETs to a drain of a respective low side FET of the plurality of low side FETs and to couple a drain of each high side FET in the plurality of high side FETs and a source of each low side FET in the plurality of low side FETs to the capacitor.

19. The method for forming the IC package of claim 18, wherein a first plurality of wire bonds couples the drain of each of the plurality of high side FETs to a respective trace of a plurality of traces on the substrate and a second plurality of wire bonds couples the source of each of the plurality of low side FETs to a respective trace of the plurality of traces on the substrate.

20. The method for forming the IC package of claim 18, wherein a first plurality of wire bonds couples the drain of each of the plurality of high side FETs to the second member of the lead frame and a second plurality of wire bonds couples the source of each of the plurality of low side FETs to the first member of the lead frame.

\* \* \* \* \*